United States Patent
Kiss et al.

(10) Patent No.: US 6,893,925 B2
(45) Date of Patent: May 17, 2005

(54) LAYOUT TO MINIMIZE GATE ORIENTATION RELATED SKEW EFFECTS

(75) Inventors: Stephen W. Kiss, Banks, OR (US); Jeffrey W. Bates, Vancouver, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/624,831

(22) Filed: Jul. 21, 2003

(65) Prior Publication Data

US 2004/0019865 A1 Jan. 29, 2004

Related U.S. Application Data

(62) Division of application No. 09/649,716, filed on Aug. 28, 2000, now Pat. No. 6,601,224.
(60) Provisional application No. 60/151,813, filed on Aug. 30, 1999.

(51) Int. Cl.[7] .................. H01L 21/336; H01L 21/8238
(52) U.S. Cl. ........................................ 438/279; 438/213
(58) Field of Search ............................... 438/213, 279, 438/323, 129

(56) References Cited

U.S. PATENT DOCUMENTS

| | | | |
|---|---|---|---|
| 4,267,632 A | * | 5/1981 | Shappir ................ 438/257 |
| 4,597,060 A | * | 6/1986 | Mitchell et al. ........ 365/185.16 |
| 4,937,075 A | * | 6/1990 | Hollingsworth et al. .... 438/275 |
| 5,404,033 A | | 4/1995 | Wong et al. |
| 5,510,999 A | | 4/1996 | Lee et al. |
| 5,796,624 A | | 8/1998 | Sridhar et al. |
| 5,887,002 A | | 3/1999 | Cooke et al. |
| 5,898,194 A | | 4/1999 | Gheewala |
| 5,910,016 A | * | 6/1999 | Kazerounian et al. ...... 438/258 |
| 5,923,569 A | | 7/1999 | Kumashiro et al. |
| 5,965,925 A | | 10/1999 | Kornachuk et al. |
| 5,990,502 A | | 11/1999 | Park |
| 6,269,199 B1 | | 7/2001 | Maloney |
| 6,323,985 B1 | | 11/2001 | Maloney |
| 6,333,656 B1 | | 12/2001 | Schober |

OTHER PUBLICATIONS

Mathias et al., "Flag: A flexible layout generator for analog MOS transistors", Jun. 6, 1998, Solid–State Circuits, IEEE Journal, vol. 33 Issue, pp.: 896–903.

* cited by examiner

Primary Examiner—Matthew Smith
Assistant Examiner—Lex H. Malsawma
(74) Attorney, Agent, or Firm—Blakely, Sokoloff, Taylor & Zafman LLP

(57) ABSTRACT

A method and apparatus for a driver layout is described. The layout includes an first number of gate lines arranged along a first axis and a second equal number of gates arranged along a second axis, such that the first set of gates lines is orthogonal to the second set of gates lines. The layout includes a total of N discrete transistors.

10 Claims, 14 Drawing Sheets

|  | Core Cell with *L* orientation mark |
|  | I/O Cell with *T* orientation mark |

LAYOUT TO MINIMIZE GATE ORIENTATION RELATED SKEW EFFECTS

The present patent application is a Divisional of Application No. 09/649,716, filed Aug. 28, 2000 now U.S. Pat No. 6,601,224, which claims the benefit to Provisional Application No. 60/151,813 filed on Aug. 30, 1999.

FIELD OF THE INVENTION

The present invention relates to integrated circuits, and more specifically, to integrated circuit layout design.

BACKGROUND

As the frequency of VLSI circuits increases, the need to control skew in critical circuits becomes increasingly important. Two major process related components of skew are optical astigmatism and angle of implantation. Both of these effects are sensitive to gate orientation.

Optical astigmatism can cause vertical and/or horizontal lines to be imaged onto a silicon wafer less accurately than normal. The accuracy of these critical dimensions (CDs) is fundamental but obviously some variance must be tolerated. Variance in the width and/or length of the intended transistor channel dimensions ultimately affects the strength, β, (Eq. 1.4), i.e. the current carrying capability of the device (Eqs 1.2 & 1.3). This effect is becoming ever more dominant as CDs continue to approach photolithographical limits.

The second source of transistor driving strength modulation, albeit less dominant, is a result of a variance in the angle of implantation. This causes a modulation of the device threshold voltage, $V_t$, resulting in a change in the effective driving strength of the device.

In the prior art, several methods have been used to control skew. Two of these are:
- use of long-channeled transistors
- guaranteeing the same gate orientation of all critical circuits.

The use of long-channel transistors minimizes the effects of poly CD variance reducing the percentage change in $L_{eff}$ (Eq. 1.6) caused by Δl. However, in order to achieve that same effective driving strength for the driver in question, the effective width, $W_{eff}$ (Eq. 1.5) must be increased so that the β of the device is equal to that of the minimum channel device. Long-channel drivers inherently consume more die area. For example, a 20% increase in $L_{eff}$ requires a 20% increase in $W_{eff}$ which translates to a 20% or more increase in silicon area required.

FIG. 1A illustrates a driver circuit that may be implemented with the various circuits described below. FIG. 1B illustrates one layout of the driver of FIG. 1A having a vertical orientation with parallel transistors. FIG. 1C illustrates an alternative layout with parallel transistors having a horizontal orientation. The driver may alternatively be implemented as a single large device, as shown in FIG. 1D. The device example shown has a W/L ratio of 12. FIG. 1E shows the horizontal embodiment of the single legged device. A vertical implementation may be done in the alternative.

Guaranteeing the same gate orientation for all critical transistors is another method of controlling skew. However, maintaining the same gate orientation is not always practical. For example, I/O cells are normally placed radially to form the I/O ring of a design as shown in FIG. 2. As can be seen, the same I/O library element is placed on both the top/bottom and left/right side of a die. Thus, the same gate orientation can not be maintained.

Therefore, an improved method of controlling skew would be advantageous.

SUMMARY OF THE INVENTION

A method and apparatus for a driver layout is described. The layout includes an first number of gate lines arranged along a first axis and a second equal number of gates arranged along a second axis, such that the first set of gates lines is orthogonal to the second set of gates lines. The layout includes a total of N discrete transistors.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A circuit layout to minimize gate orientation related skew effects is described. This layout, for a driver with N gates, orients N/2 gates horizontally and N/2 vertically to reduce skew in integrated circuits. This is fundamentally different from selecting specific gate orientation for skew sensitive circuits on a die. For one embodiment, this driver can be referred to as a T4 driver, for tic-tac-toe Transistor layout.

The T4 driver minimizes skew by reducing the overall range of drain current, $I_{ds}$, resulting from optical astigmatism variances. All other process parameters being equal, i.e. uE/tox constant, the skew of driver strength can be directly controlled by minimizing the range of β.

For simplicity sake, the following set of equations discussed vertical and horizontal astigmatism effects separately. If it can be shown that $β_{current}$ is in the middle of possible values for both single and multi-legged device oriented either vertically or horizontally, then the T4 layout provides a circuit less sensitive to gate orientation skew effects. The T4 driver minimizes skew due to optical astigmatism—defined in the background section—by reducing the minimum and maximum ranges of the transistor. The discussion below, for simplicity addresses the stricture of a N-type metal oxide semiconductors (NMOS).

The basic MOS transistor equations for $I_{ds}$, the drain to source current for a transistor, are:

$$I_{ds} = 0 \quad V_{gs} \leq V_t \quad \text{(cutoff)} \tag{1.1}$$

$$I_{ds} = β * \left[ (V_{gs} - V_t)V_{ds} - \frac{V_{ds}^2}{2} \right] \tag{1.2}$$

$$0 < V_{ds} < V_{gs} - V_t \quad \text{(non-saturation)}$$

Figure 1A:
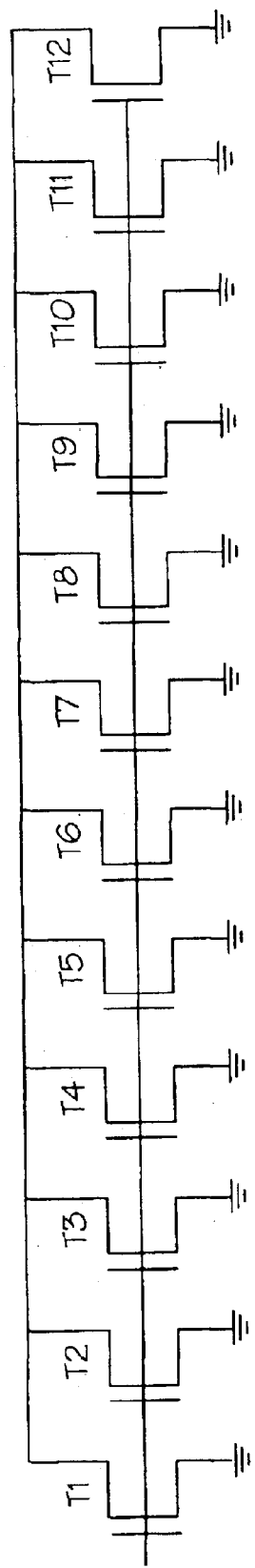
FIG. 1A is a circuit diagram of a driver circuit.
Figure 1B:
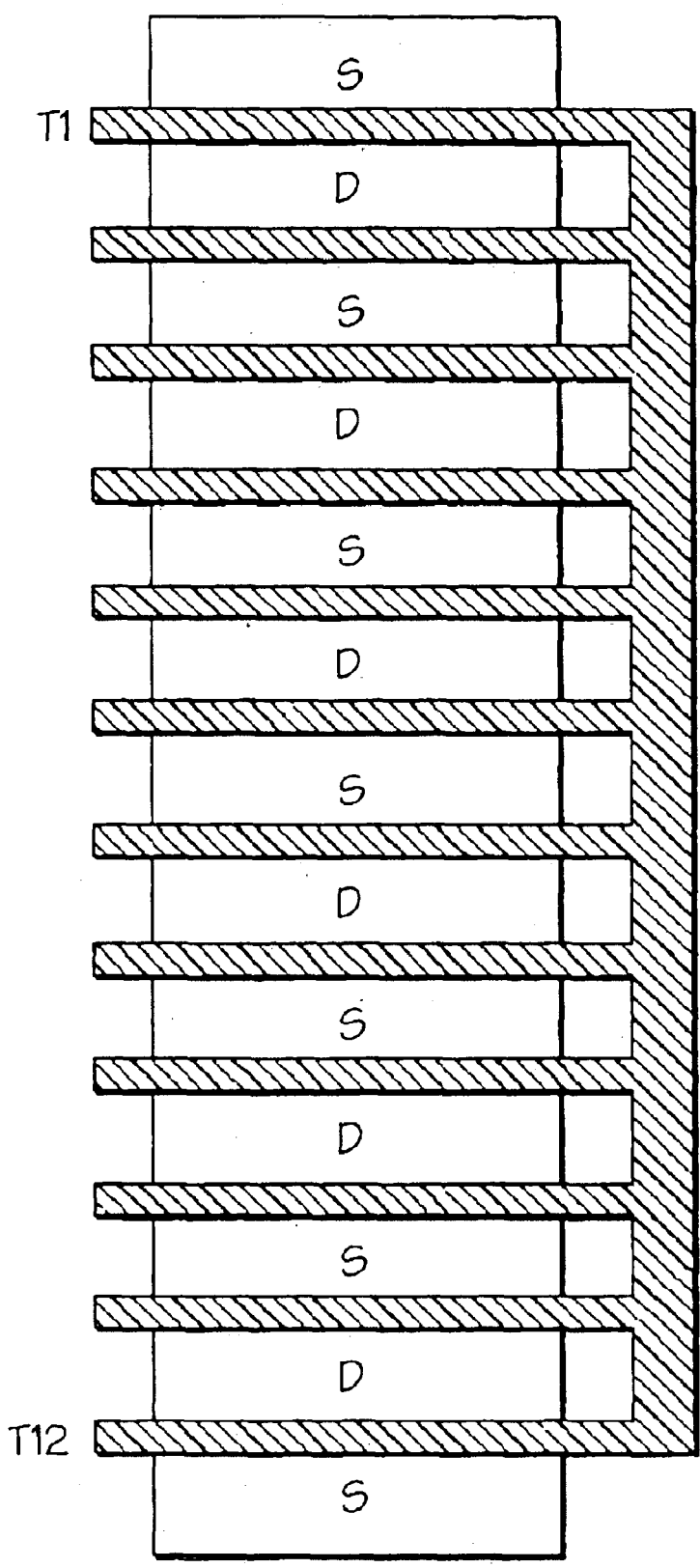
FIGS. 1B–1E are circuit diagrams and layouts of prior art transistors.
Figure 1C:
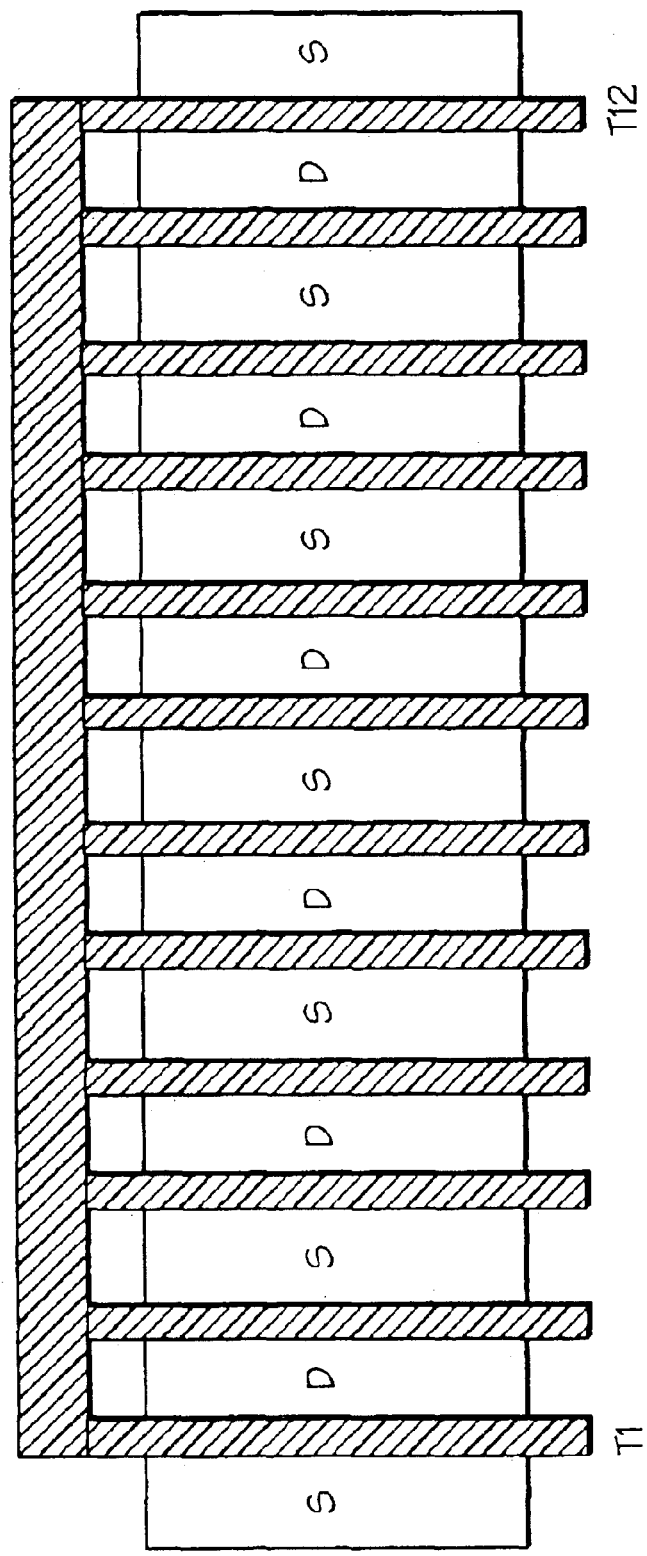
Figure 1D:
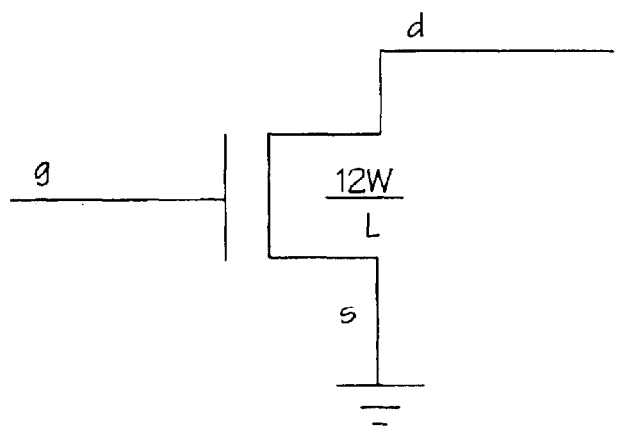
Figure 1E:
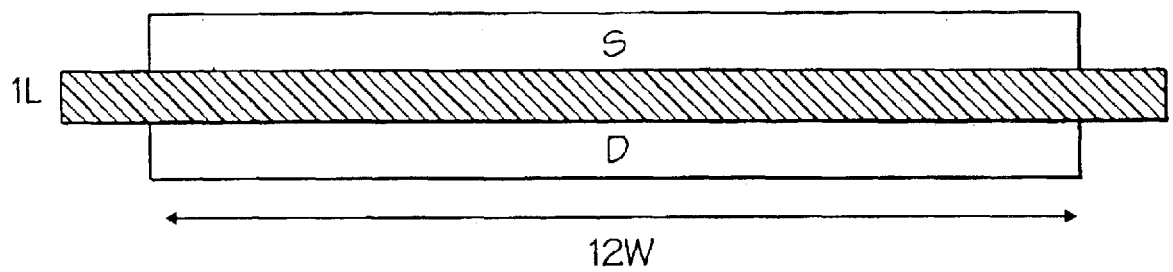
Figure 2:
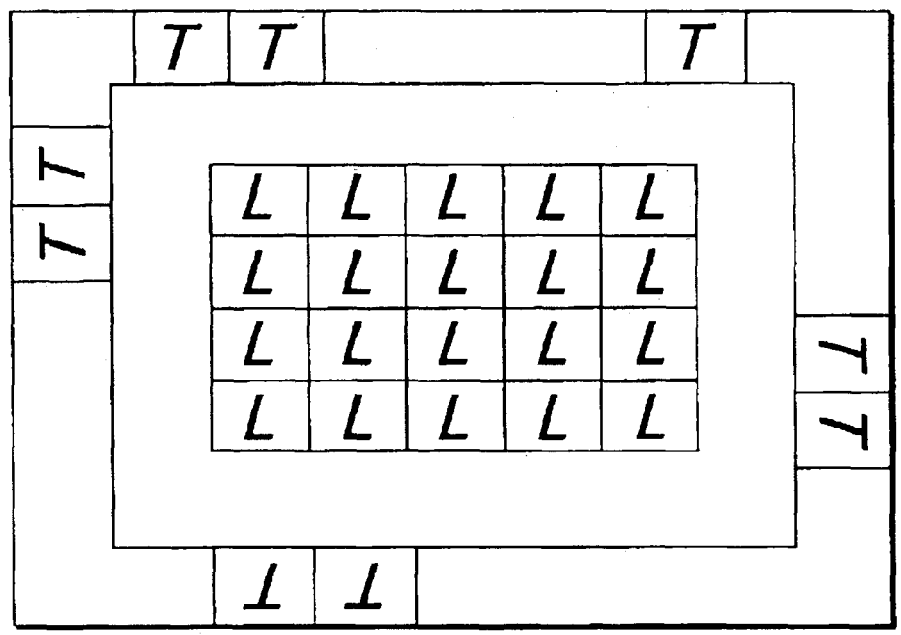
FIG. 2 is a layout of a prior art I/O ring design.
Figure 2:
Figure 2:
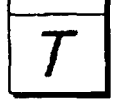

-continued $$I_{ds} = \beta * \left[\frac{(V_{gs} - V_t)^2}{2}\right] \quad 0 < V_{gs} - V_t < V_{ds} \quad \text{(saturation)} \quad (1.3)$$

Where $V_{gs}$ is the gate to source voltage, $V_t$ is the device threshold voltage, $V_{ds}$ is the drain to source voltage, and β is the transistor gain factor, such that $$\beta = \frac{\mu\varepsilon}{t_{ox}} * \left[\frac{W_{eff}}{L_{eff}}\right], \text{ where } \frac{\mu\varepsilon}{t_{ox}} \quad (1.4)$$

is the process dependent factor, where is the effective surface mobility of carriers (electrons or holes), ε is the permittivity of the gate insulator, $t_{ox}$ is the thickness of the gate insulator, $W_{eff}$ is the effective width of the channel, and $L_{eff}$ is the effective length of the channel such that (1.5) $W_{eff}$=W±Δw (1.6) $L_{eff}$=L±Δl, where Δw is the diffusion critical dimension variance, and Δl is the poly critical dimension variance Based on these equations, the transistor gain factor can be calculated for various circuit types. For one embodiment, for this calculation it can be assumed that the process dependent factor is a constant, k. Thus, for the circuits described in FIG. 1D, a single legged circuit, the value of β is $$\beta_{1t} = k * \left[\frac{12W \pm \Delta w}{L \mp \Delta}\right], \quad (2.1)$$

while for the twelve parallel legged circuit shown in FIG. 1B, the value of β is $$\beta_{12t} = k * \left[\frac{12(W \pm \Delta w)}{L \mp \Delta}\right]. \quad (2.2)$$

The value of β for the circuit described below in FIG. 3 is $$\beta_{current} = k * \left[\frac{6(W \pm \Delta w)}{L \mp \Delta 1} + \frac{6(W \mp \Delta w)}{L \pm \Delta 1}\right], \quad (2.3)$$

since half of the transistors are horizontally oriented, while the other half of the transistors are vertically oriented.

Figure 4:
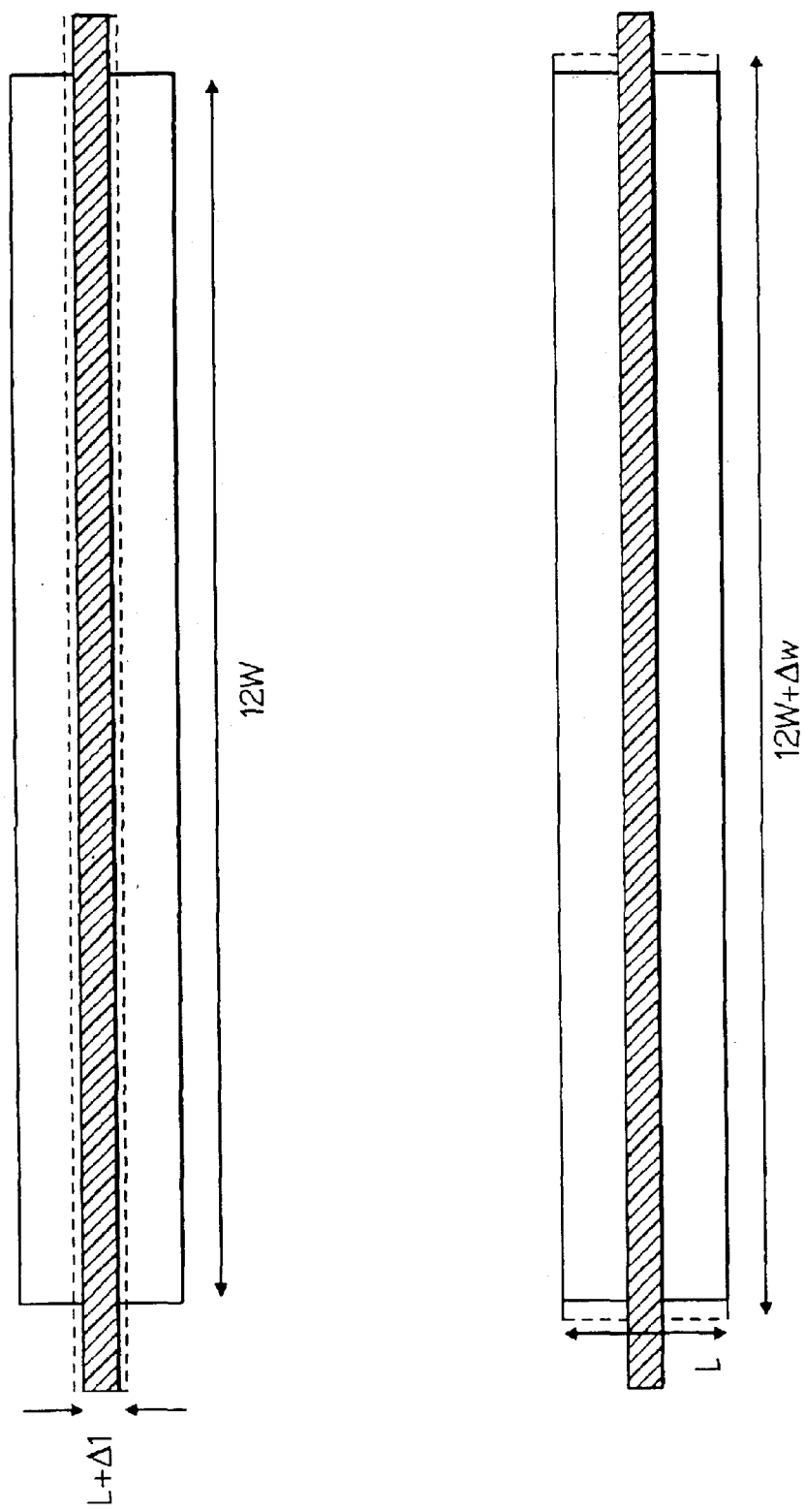
FIG. 4 is a layout illustrating optical astigmatism.

Four specific examples are described below with respect to FIG. 4, illustrating two types of astigmatism, vertical and horizontal. Optical astigmatism can cause vertical and/or horizontal lines to be imaged onto a silicon wafer less accurately than normal.

Case I(a)—vertical astigmatism, along axis x and y, Δx>0, Δy=0. For this example, for simplicity, the process dependent factors are assumed to be constant and are not shown. In this case, $$\beta_{h1t} = \left[\frac{12(W + \Delta w)}{L + \Delta y}\right] = \frac{12(W + \Delta x)}{L}, \beta_{v1t} = \left[\frac{12(W + \Delta y)}{L + \Delta x}\right] = \frac{12W}{L + \Delta x}$$

$$\beta_{h12t} = \left[\frac{12(W + \Delta x)}{L + \Delta y}\right] = \frac{12W + 12\Delta x}{L}, \beta_{v12t} = \left[\frac{12(W + \Delta y)}{L + \Delta x}\right] = \frac{12W}{L + \Delta x}$$

$$\beta_{current} = \left[\frac{6(W + \Delta x)}{L + \Delta y} + \frac{6(W + \Delta y)}{L + \Delta x}\right] = \left[\frac{(6W + 6\Delta x)}{L} + \frac{6W}{L + \Delta x}\right],$$

thus, $\beta_{v12t}=\beta_{v1t}<\beta_{current}<\beta_{h1t}<\beta_{h12t}$, similarly, it can be proven that for Case I(b), where Δx<0, Δy=0, $\beta_{h12t}<\beta_{h1t}<\beta_{current}<\beta_{v1t}=\beta_{v12t}$. Thus it appears that $\beta_{current}$, having an equal number of transistors oriented horizontally and vertically is less sensitive to vertical astigmatism than either of the two prior art methods.

Similarly, for Case II(a), horizontal astigmatism, where Δx=0, Δy>0, $$\beta_{h1t} = \left[\frac{12W + \Delta x}{L + \Delta y}\right] = \frac{12W}{L + \Delta y}, \beta_{v1t} = \left[\frac{12W + \Delta y}{L + \Delta x}\right] = \frac{12W + \Delta y}{L}$$

$$\beta_{h12t} = \left[\frac{12(W + \Delta x)}{L + \Delta y}\right] = \frac{12W}{L + \Delta y}, \beta_{v12t} = \left[\frac{12(W + \Delta y)}{L + \Delta x}\right] = \frac{12W + 12(\Delta y)}{L}$$

$$\beta_{current} = \left[\frac{6(W + \Delta x)}{L + \Delta y} + \frac{6(W + \Delta y)}{L + \Delta x}\right] = \left[\frac{6W}{L + \Delta y} + \frac{(6W + 6(\Delta y))}{L}\right],$$

thus, $\beta_{h12t}=\beta_{h1t}<\beta_{current}<\beta_{v1t}<\beta_{v12t}$, similarly, it can be proven that for Case II(b), where Δx=0, Δy<0, $\beta_{v12t}<\beta_{v1t}<\beta_{current}<\beta_{h1t}=\beta_{h12t}$. Thus it appears that $\beta_{current}$, having an equal number of transistors oriented horizontally and vertically is less sensitive to horizontal astigmatism than either of the two prior art methods.

Astigmatism may have both horizontal and vertical aspects. Since $\beta_{current}$ is less sensitive to horizontal astigmatism, and $\beta_{current}$ is less sensitive to vertical astigmatism, therefore $\beta_{current}$ is less sensitive to a combined horizontal and vertical astigmatism.

For one embodiment, this structure, which is a fundamental building block, can be stepped and repeat in both X and Y directions to create stronger drivers. The basic twelve transistor structure shown in FIG. 3A below can be permutated by removing an even number of transistor legs to create other structures. For example T9–T12 may be removed to create an O-ring device, as shown in FIG. 3B. A single pair of legs may also be used to generate four transistors, as shown in FIG. 3C. Any even number of transistors may be set in this structure, such that half of the transistors are orthogonal to the other half of the transistors. By using such a layout of transistors, skew effects are minimized.

Common library elements which can not be placed to guarantee the same orientation for a specific gate, e.g. I/O cells for bond-wire designs, can use this layout method to eliminate gate orientation skew.

The T4 driver can also reduce the modulations in threshold voltage, Vt, resulting from implant angle variations which can arise between orthogonally oriented transistors. It can be seen in both the saturated and non-saturated current equations, that variations in Vt will cause variations in driver current. These Vt variations also skew the behavior of the driver and minimizing these is beneficial to controlling overall circuit skew. Keeping the gate orientation of N/2 transistors orthogonal to the other half of transistors, forces all T4 driver configuration to experience that same set of variations. In much the same way as with optical astigmatism, this minimizes the magnitude of Vt variance.

Figure 3A:
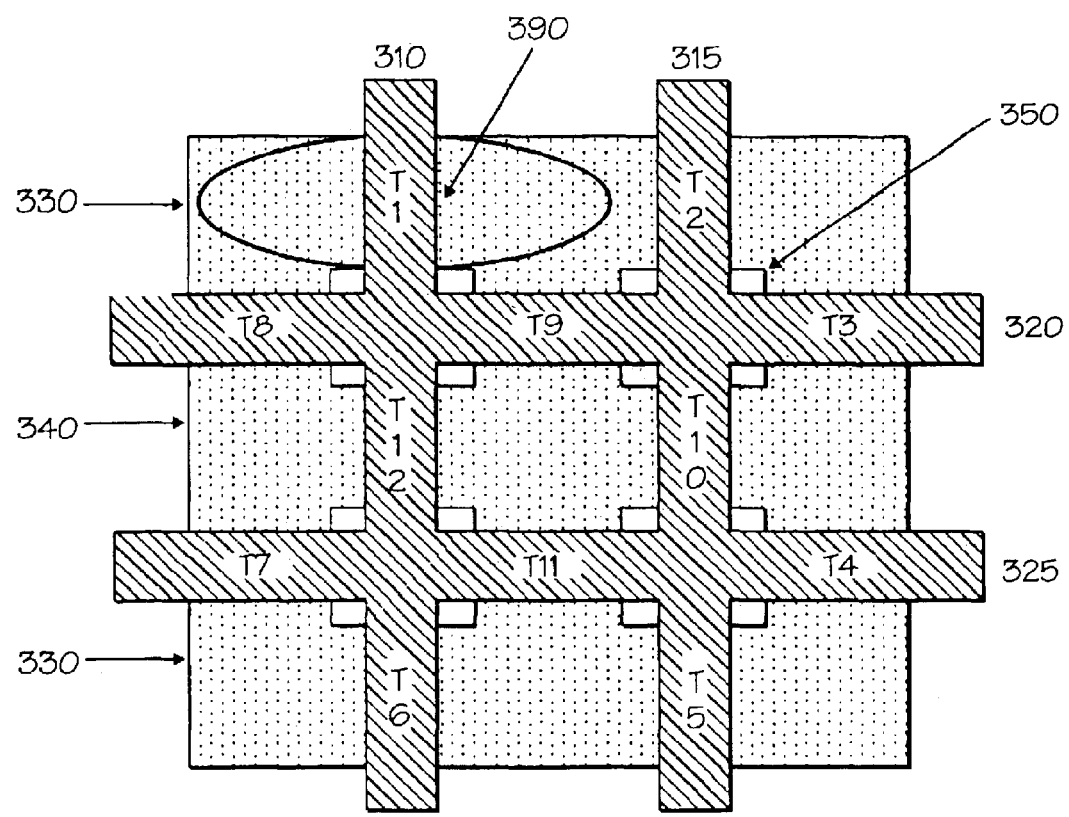
FIGS. 3A–C are one embodiment of layouts of circuits according to one embodiment of the present invention.
Figure 3B:
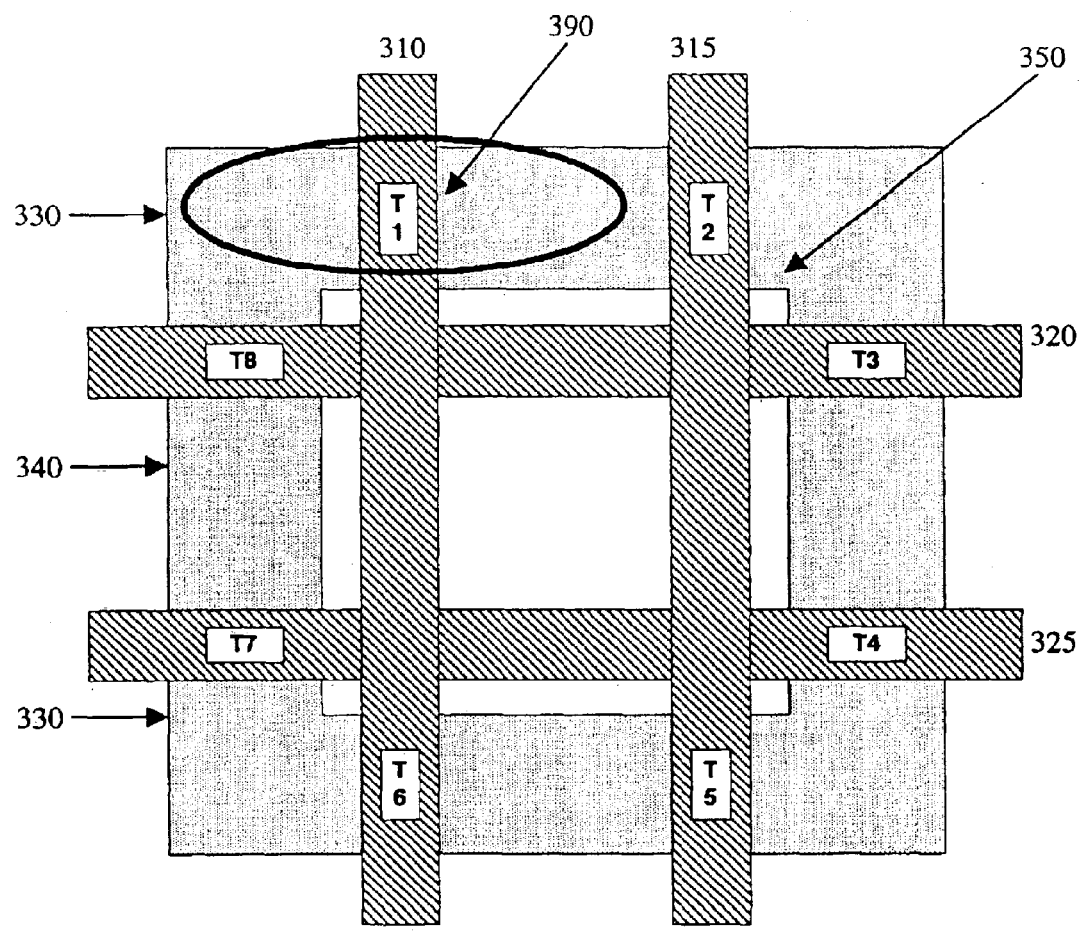
Figure 3C:
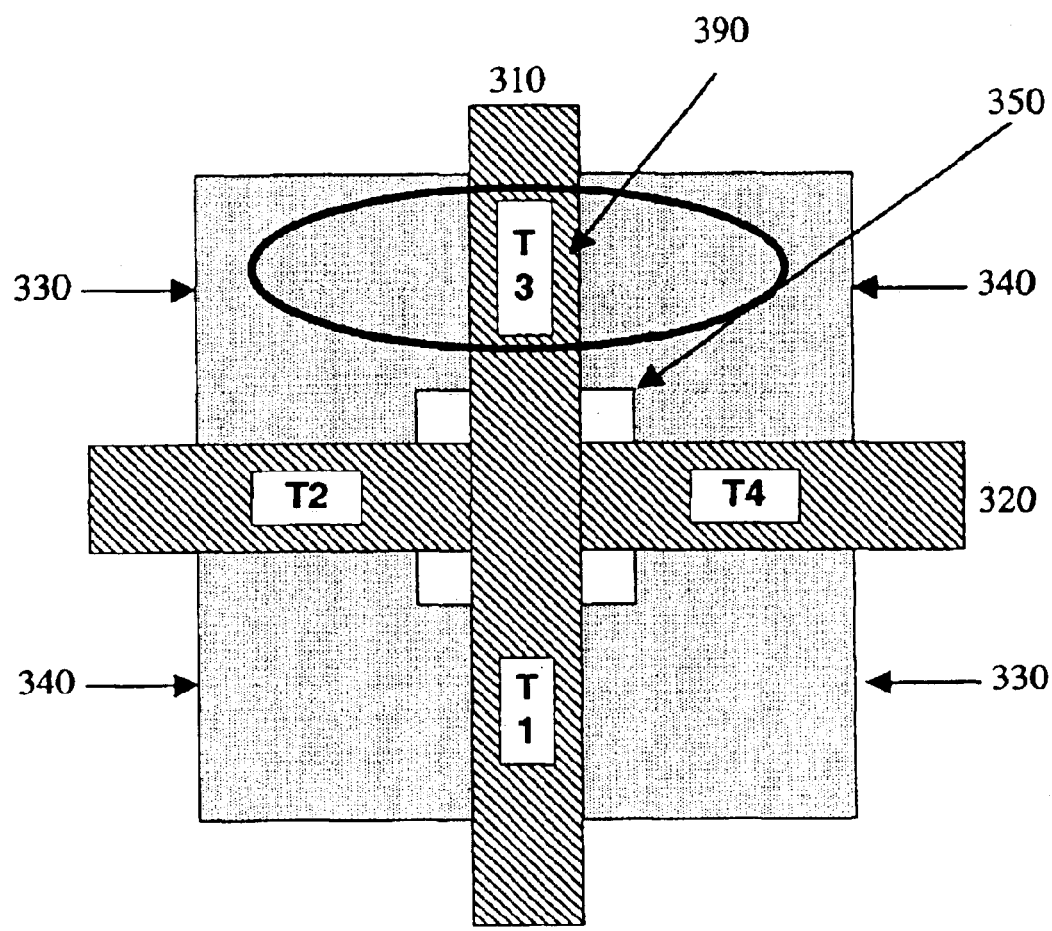

FIG. 3A illustrates an exemplary layout of a T4 driver. The driver includes twelve transistors T1 to T12 arranged symmetrically along four legs 310–325. The legs 310–325 are arranged in a bilaterally symmetric format. The legs 310–325 form the gates of transistors T1 340 to T12. For one embodiment, the legs 310–325 are polysilicon. Alternatively, the legs 310–325 may be metal, or another conductive material. The legs 310–325 are placed on a substrate (not shown). The substrate includes source 330 and drain sections 340, in an alternating pattern. Thus, for example, all corners and the center section may be source sections 330, while the other sections are drain sections 340. Around each crossing of the legs 310–320 is a non-diffused area 350. The interconnections between the source are not shown. For one embodiment, the sources may be tied together and the drains may be tied together, using metal layers.

Thus, for example, one transistor, T1 390, is circled, including a portion of leg 310 and adjacent source 330 and drain 340 areas. Transistor T1 390 shares a source with transistor T8, and a drain with transistor T2. The gate area of the transistor T1 390 is defined by the edge of the structure and the non-diffused area 350. FIGS. 3B and 3C illustrate permutations of this design, with fewer number of transistors. Similarly, additional transistors may be added to the system, while balancing the number of transistors.

FIG. 4 is a layout illustrating optical astigmatism. For simplicity, the system is described as being horizontally oriented, such that the diffusion area extends horizontally. The first figure shows a vertical astigmatism, where $\Delta y > 0$, and $\Delta x = 0$. The second figure shows horizontal astigmatism, where $\Delta x > 0$, and $\Delta y = 0$. Of course, astigmatism may involve both an x and a y component, but this is not shown in FIG. 4.

Figure 5A:
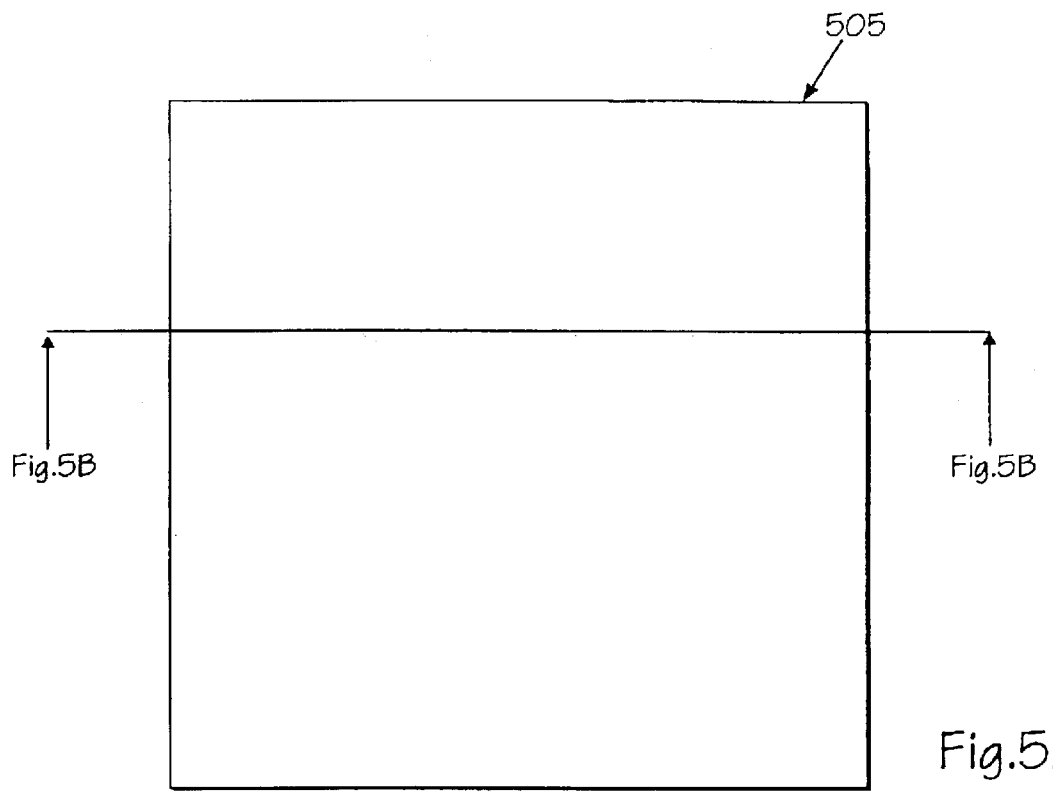
FIGS. 5A–8C illustrate one embodiment of step-by-step manufacturing of the driver circuit of FIG. 3.
Figure 5B:
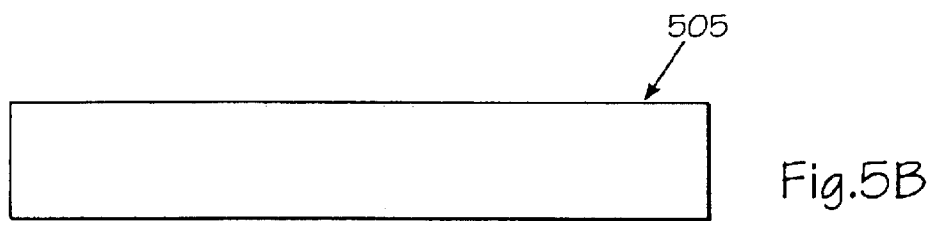
Figure 5C:
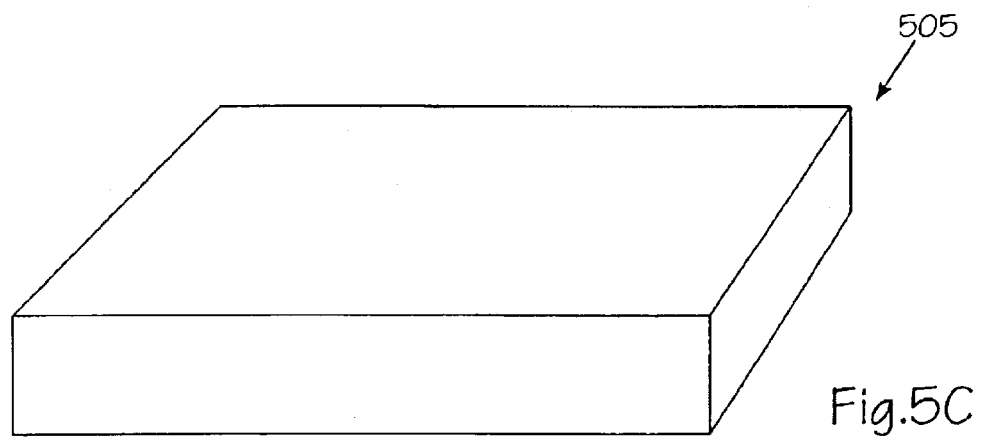

FIGS. 5A–C illustrate top, side, and perspective views of the substrate on which a transistor layout according to the present invention may be implemented. For one embodiment, the substrate is a silicon substrate. Alternatively, ceramics, sapphire, or other materials may be used for the substrate.

Figure 6A:
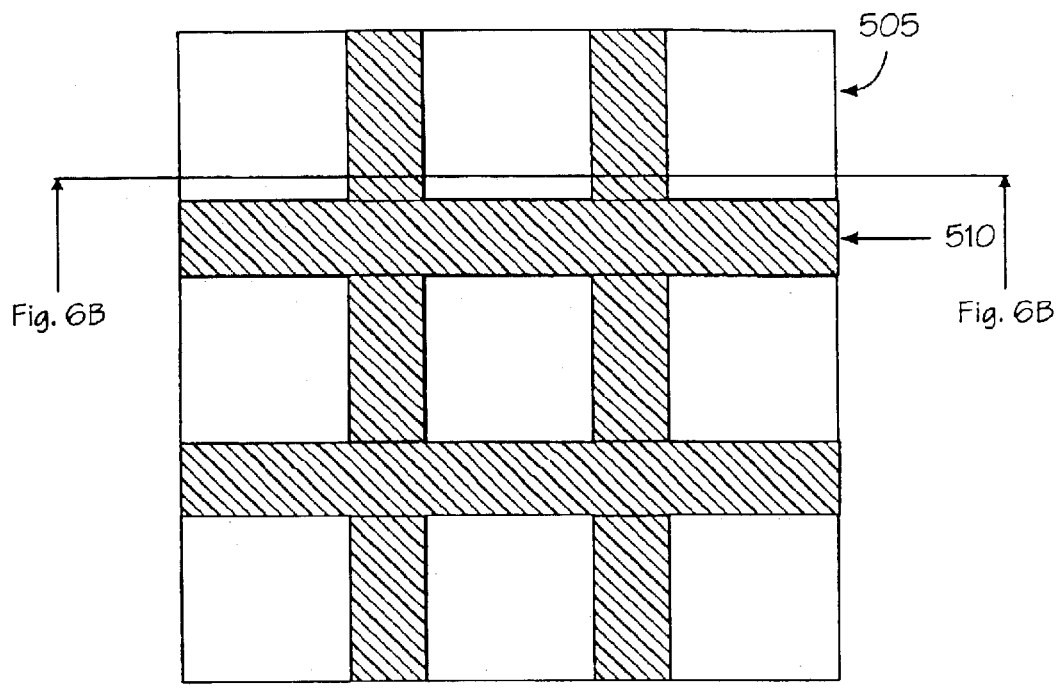
Figure 6B:
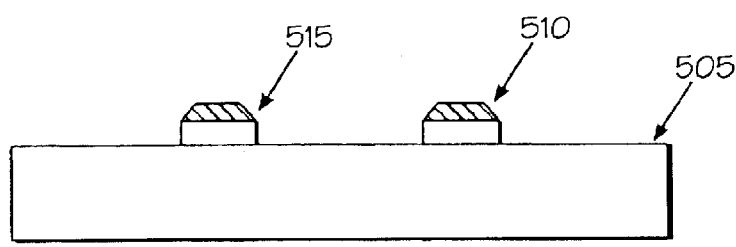
Figure 6C:
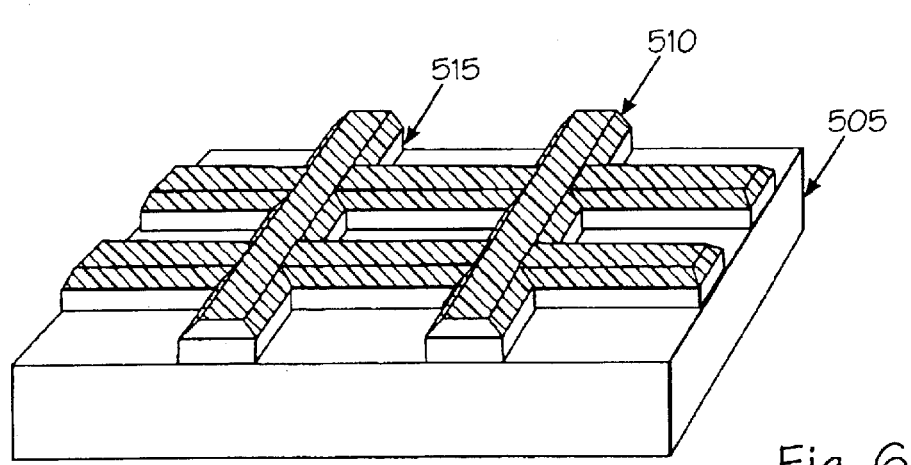

FIGS. 6A–C illustrate top, side, and perspective views of the substrate after a first layer of a conductor 510 has been deposited. This conductor 510 forms the gate for the transistor. For one embodiment, the stage shown at FIGS. 6A–C is achieved by a two step process, initially depositing a layer of conductor 510, and then etching away the material 510. For one embodiment, a layer of silicon dioxide ($SiO_2$) 515 is deposited on the substrate prior to the conductor 510 deposition. For another embodiment, another material may be used in place of the silicon dioxide. This $SiO_2$ layer 515 is removed with the conductive layer 510, leaving a layer of $SiO_2$ layer 515 underneath the conductor layer 510. For one embodiment, the conductor 510 is a metal layer. For another embodiment, the conductor 510 is a polysilicon, layer. Alternative materials may be used.

Figure 7A:
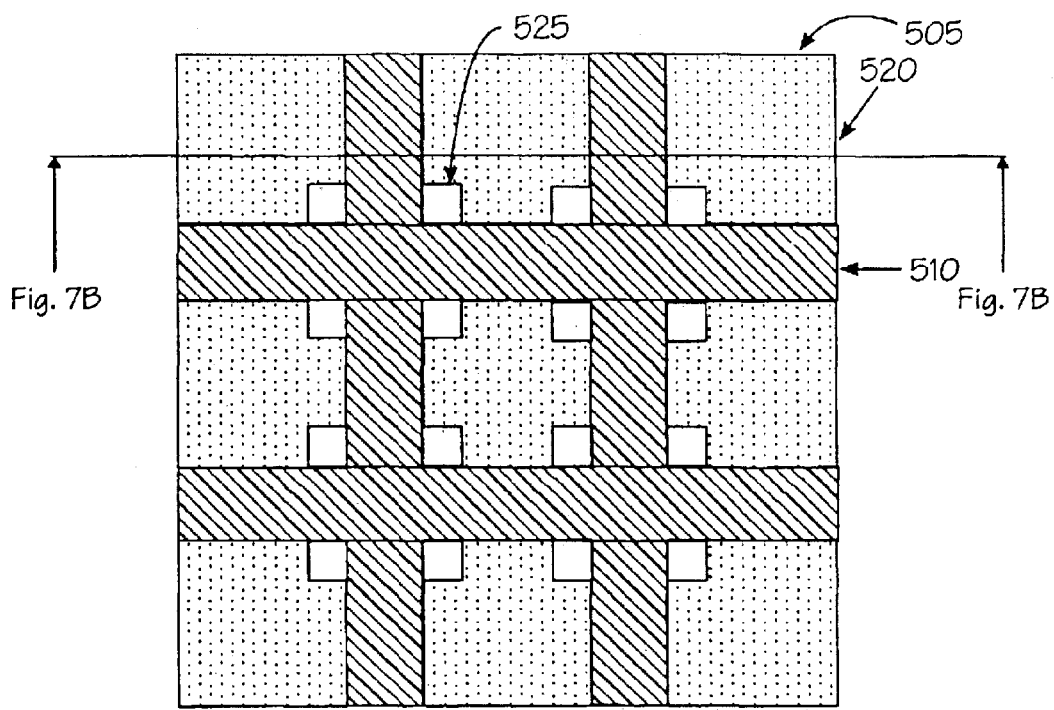
Figure 7B:
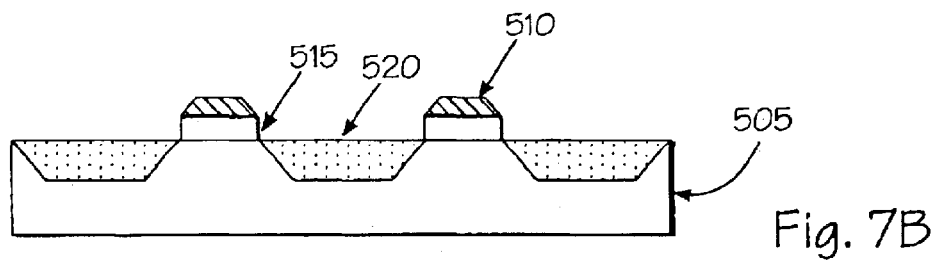
Figure 7C:
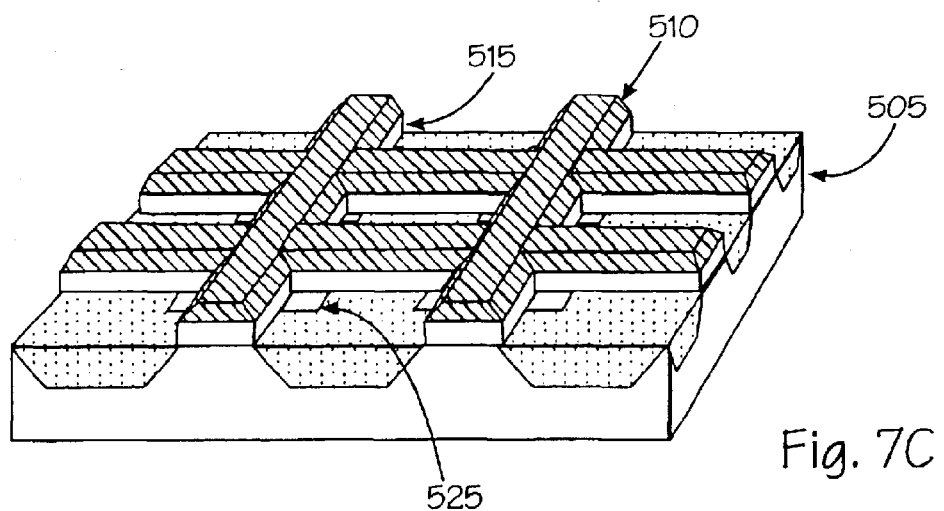
Figure 9:
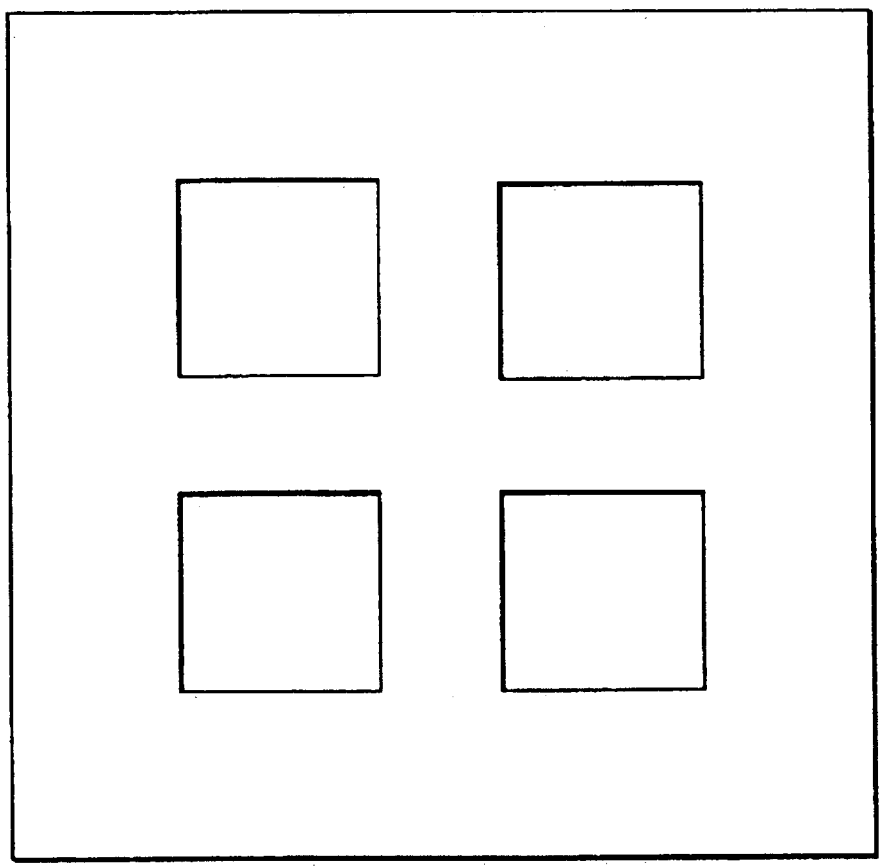
FIG. 9 illustrates one embodiment of a diffusion plate that may be used to create the diffusion areas shown in FIG. 7A.

FIGS. 7A–C illustrate top, side, and perspective views of the substrate after a diffusion step. The diffusion step creates the source and drain regions 520. For one embodiment, the step further dopes the gate 510. The diffusion step creates non-diffused areas 525, centered around the intersection of gates 510. FIG. 9 illustrates a diffusion plate 910 that may be used to create the diffusion areas shown in FIG. 7C. With this step a complete transistor is formed, with the gate area 515 surrounded on either side by a source 530 and drain 540 contact.

Figure 8A:
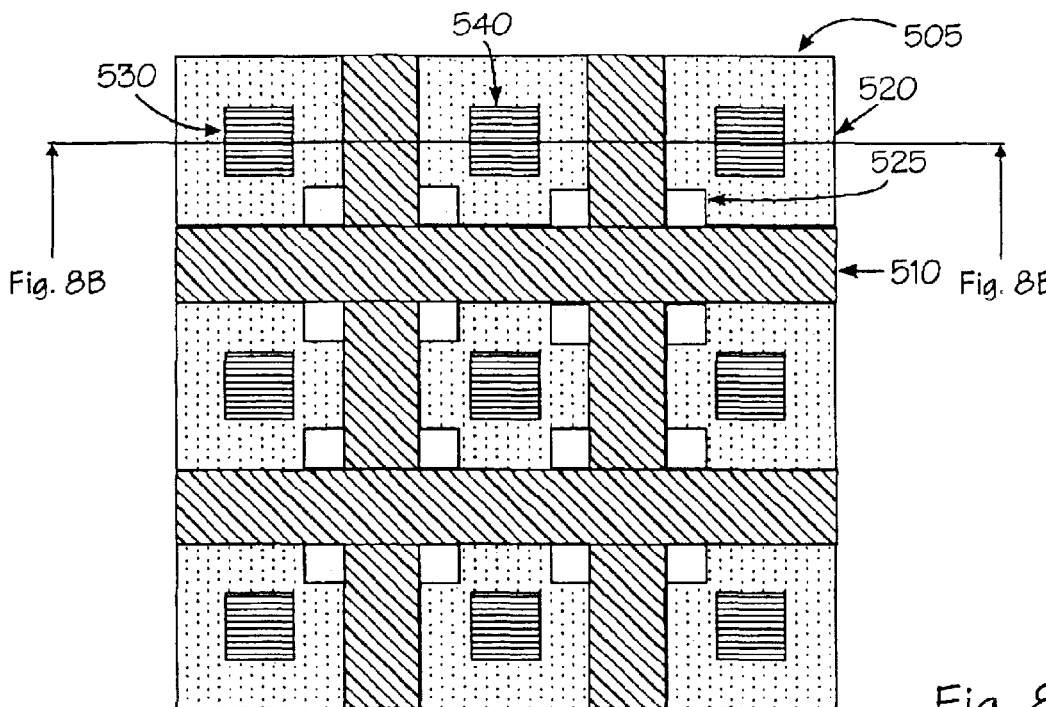
Figure 8B:
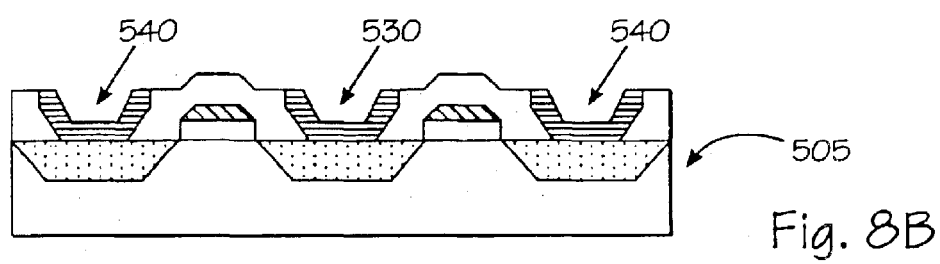
Figure 8C:
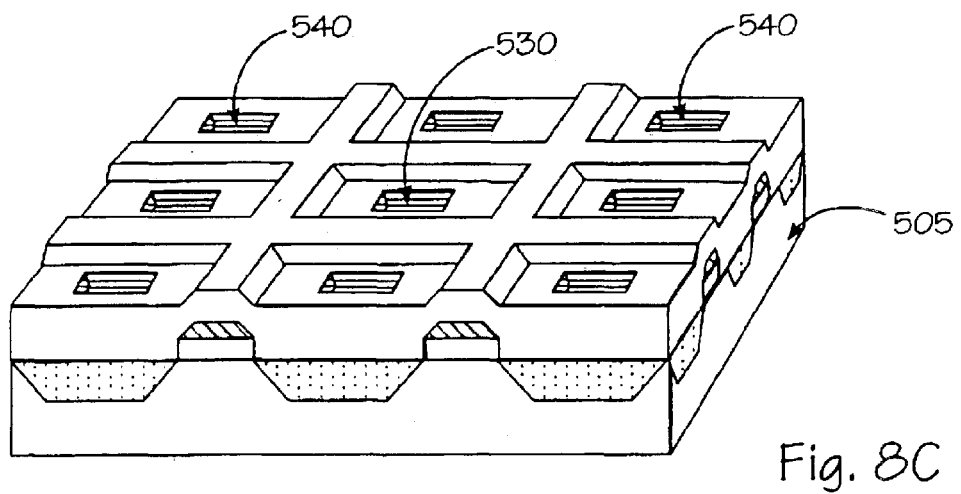

FIGS. 8A–C illustrate top, side, and perspective views of the substrate after contact windows are established. The contact windows 530,540 permit the transistor to be hooked up to other devices. This figure does not show the interconnections between the source and drain contacts of each transistor. However, by interconnecting the source and drain areas appropriately, various circuits may be created.

In this way, a symmetric set of drivers is manufactured, with transistors in both directions.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of making a symmetric transistor device comprising:

depositing a first conductive layer on a substrate, the first conductive layer forming an even number of transistor legs, laid out in an intersecting pattern, forming a bilaterally symmetric base;

doping the substrate to form source and drain regions and non-diffused areas around the intersections of the transistor legs; and forming a plurality of transistors defined by a portion of a transistor leg forming a gate and the source and drain areas on either side of the leg forming a source and a drain.

2. The method of claim 1, further comprising: depositing a silicon dioxide prior to depositing the first conductive layer.

3. The method of claim 1, wherein the intersecting pattern forms a tic-tac-toe pattern.

4. The method of claim 1, wherein the first conductive layer comprises polysilicon.

5. The method of claim 1, further comprising: conductive interconnections between the source and drain areas to form a circuit.

6. The method of claim 1, wherein a first half of the transistors are oriented along a first axis and a second half of the transistors (N/2) oriented along a second axis orthogonal to the first half of the transistors.

7. The method of claim 6, wherein the minimum drawn W/L is used for each transistor leg.

8. A method of making a symmetric transistor device comprising:

depositing a first conductive layer on a substrate, the first conductive layer forming an even number of transistor legs, laid out in an intersecting pattern, forming a bilaterally symmetric base;

doping the substrate to form source and drain regions; and forming a plurality of transistors defined by a portion of a transistor leg forming a gate and the source and drain areas on either side of the leg forming a source and a drain, so as to reduce skew effects due to mask alignment and gate orientation.

9. The method of claim 8, wherein a first half of the transistors are oriented along a first axis and a second half of the transistors (N/2) oriented along a second axis orthogonal to the first half of the transistors.

10. The method of claim 8, wherein variations in threshold voltage are reduced.

* * * * *

UNITED STATES PATENT AND TRADEMARK OFFICE
CERTIFICATE OF CORRECTION

PATENT NO. : 6,893,925 B2
DATED : May 17, 2005
INVENTOR(S) : Kiss et al.

It is certified that error appears in the above-identified patent and that said Letters Patent is hereby corrected as shown below:

Column 5,
Line 24, delete "number" and insert -- numbers --.

Signed and Sealed this

Twelfth Day of July, 2005

JON W. DUDAS
*Director of the United States Patent and Trademark Office*